(12) United States Patent
Tuttle

(10) Patent No.: US 7,319,190 B2
(45) Date of Patent: Jan. 15, 2008

(54) THERMAL PROCESS FOR CREATION OF AN IN-SITU JUNCTION LAYER IN CIGS

(75) Inventor: John R. Tuttle, Mechanicville, NY (US)

(73) Assignee: Daystar Technologies, Inc., Halfmoon, NY (US)

(*) Notice: Subject to any disclaimer, the term of this patent is extended or adjusted under 35 U.S.C. 154(b) by 81 days.

(21) Appl. No.: 11/272,386

(22) Filed: Nov. 10, 2005

(65) Prior Publication Data

US 2006/0102230 A1 May 18, 2006

Related U.S. Application Data

(60) Provisional application No. 60/626,843, filed on Nov. 10, 2004.

(51) Int. Cl.
*H01L 31/00* (2006.01)
(52) U.S. Cl. .................. 136/264; 136/262; 136/265
(58) Field of Classification Search ........... 136/262, 136/264, 265
See application file for complete search history.

(56) References Cited

U.S. PATENT DOCUMENTS

| | | |
|---|---|---|
| 4,392,451 A | 7/1983 | Mickelsen et al. |
| 4,576,830 A | 3/1986 | Kiss |
| 4,663,829 A | 5/1987 | Hartman et al. |
| 4,851,095 A | 7/1989 | Scobey |
| 5,343,012 A | 8/1994 | Hardy |
| 5,411,592 A | 5/1995 | Ovshinsky et al. |
| 5,470,784 A | 11/1995 | Coleman |
| 5,849,162 A | 12/1998 | Bartolomei |
| 6,270,861 B1 | 8/2001 | Mashburn |
| 6,288,325 B1 | 9/2001 | Jansen et al. |
| 6,323,417 B1 | 11/2001 | Gillespie et al. |
| 6,554,950 B2 | 4/2003 | van Mast |
| 6,881,647 B2 | 4/2005 | Stanbery |
| 2004/0063320 A1 | 4/2004 | Hollars |
| 2005/0056863 A1 | 3/2005 | Negami et al. |

OTHER PUBLICATIONS

Tuttle, J.R. et al, "Investigations Into Alternative Substrate, Absorber, and Buffer Layer Processing for Cu(In,Ga)Se2-Based Solar Cells", 25th PVSC; May 13-17, 1996. pp. 797-800.*

Nakada, T. et al, "Superstrate-Type CuInSe2 Thin Fllm Solar Cells with Selenide Buffer Layers", 25th PVSC; May 13-17, 1996. pp. 893-896.*

Kampmann, A. et al, "A Cadmium-free CuInSe2 Superstrate Solar Cell Fabricated by Electrodeposition Using a ITO/In2Se3/CuInSe2/Au Structure", Prog. Photovolt: Res. Appl. 7, 129-135. (1999).*

(Continued)

*Primary Examiner*—Nam Nguyen
*Assistant Examiner*—Jeffrey Barton
(74) *Attorney, Agent, or Firm*—Hiscock & Barclay, LLP.; Thomas R. FitzGerald, Esq.

(57) ABSTRACT

The present invention relates generally to the field of photovoltaics and more specifically to manufacturing thin-film solar cells using a thermal process. Specifically, a method is disclosed to manufacture a CIGS solar cell by an in-situ junction formation process.

10 Claims, 1 Drawing Sheet

OTHER PUBLICATIONS

K. Ramanthan, F.S. Hasoon, S. Smith, D.L. Young and M.A. Contreras, P.K. Johnson, A.O. Pudov and J.R. Sites, "Surface Treatment of CuInGaSe$_2$ Thin Films and its Effect on the Photovoltaic Properties of Solar Cells", Presented at the 13th ICTMC, held Oct. 14-18, 2002.

Robert W. Birkmire of the Institute of Energy Conversion, University of Delaware, "Compound Polycrystalline Solar Cells: Recent Progress and Y2K Perspctive", date not available.

Dominik Rudmann, "Effects of Sodium on Growth and Properties of Cu(In,Ga)Se$_2$ Thin Fllms and Solar Cells", A dissertation submitted to the Swiss Federal Institute of Technology (Eth) Zürich, 2004.

Marika Bodeg Ard, Karin Granath and Lars Stolt, "Growth of Cu(In,Ga) Se$_2$ Thin Films by Coevaporation Using Alkaline Precursors", *Thin Solid Films*, 2000, pp. 9-16, vol. 361-362, Elsevier Science S.A.

A. Rocket, "The Effect of Na in Polycrystalline and Epitaxial Single-Crystal CuIn$_{1-x}$ Ga$_x$Se$_2$", *Thin Solid Films*, 2005, pp. 2-7, vol. 480-481, Elsevier Science S.A.

D. Rudmann, D. Bremaud, A.F. da Cunha, G. Bilger, A. Strohm, M. Kaelin, H. Zogg and A.N. Tiwari, "Sodium Incorporation Strategies for CIGS Growth at Different Temperatures", *Thin Solid Films*, 2004, pp. 55-60, vol. 480-481, Elsevier Science S.A.

Tokio Nakada, Hiroklohbo, Masakazu Fukuda and Akio Kunioka, "Improved Compositional Flexibility of Cu(In,Ga)Se$_2$ -Based Thin Film Solar Cells by Sodium Control Technique", *Solar Energy Materials and Solar Cells*, 1997, pp. 261-267, vol. 49, Elsevier Science B.V.

V. Probst, J. Rimmasch, W. Riedl, W. Stetter, J. Holz, H. Harms and F. Karg, "The Impact of Controlled Sodium Incorporation on Rapid Thermal Processed Cu(InGa)Se$_2$—Thin Films and Devices", First WCPEC, Dec. 5-9, 1994, Hawaii.

M. Ruckh, D. Schmid, M. Kaiser. R. Sch,äffler, T. Walter and H.W. Schock, "Influence of Substrates on the Electrical Properties of Cu(InGa)Se$_2$ Thin Films", First WCPEC, Dec. 5-9, 1994, Hawaii.

Miguel A. Contreras, B. Egaas, P. Dippo, J. Webb, J. Granata, K. Ramanathan, S. Asher, A. Swartzlander and R. Noufi, "On the Role of Na and Modifications to Cu(InGa)Se$_2$ Absorber Materials Using Thin-MF (M=Na, K, Cs) Precursor Layers" 26th PVSC, Sep. 30-Oct. 3, 1997, Anaheim, CA.

* cited by examiner

THERMAL PROCESS FOR CREATION OF AN IN-SITU JUNCTION LAYER IN CIGS

CROSS-REFERENCE TO RELATED APPLICATIONS

This application claims priority from U.S. Provisional Patent Application Ser. No. 60/626,843, filed Nov. 10, 2004.

FIELD OF THE INVENTION

The invention disclosed herein relates generally to the field of photovoltaics and more specifically to creating thin-film solar cells using an in-situ junction process.

BACKGROUND OF THE INVENTION

Relatively efficient photovoltaic ("PV") cells can be manufactured in the laboratory; however, it has proven difficult to commercially scale these processes with the consistent repeatability and efficiency critical for commercial viability. The lack of an efficient thin-film manufacturing process has contributed to the failure of PV cells to effectively replace traditional energy sources in the market. Translating laboratory batch processing methods into effective industrial processes that are both cheaper and better controlled would help advance PV technology to mainstream markets.

Without an efficient thin-film manufacturing process, PV cells cannot effectively replace current energy sources. To manufacture a PV cell, a thin semiconductor layer of PV materials is deposited on a supporting layer such as glass, metal, or plastic foil. Since thin-film direct bandgap semiconductor materials have higher light absorptivity than indirect bandgap crystalline semiconductor materials, PV materials are deposited in extremely thin consecutive layers of atoms, molecules, or ions. The basic photovoltaic stack design exemplifies the typical structure of a PV cell. In that design, the cell comprises a substrate, a barrier layer, a back contact layer, a semiconductor layer, alkali materials, an n-type junction buffer layer, an intrinsic transparent oxide layer, and a conducting transparent oxide layer.

Compounds of copper indium diselenide (CIS) with gallium substituted for all or part of the indium (CIGS) and/or sulfur substituted for all or part of the selenium (CISS) have the most promise for use in absorber layers in thin-film solar cells. CIGS cells have demonstrated the highest efficiencies and good stability as compared to other absorber layer compounds. Typically, CIGS films are deposited by vacuum-based techniques. However, the multiple layers comprising a PV device offer challenges to a mass production system. Presently, there is no proven technology for continuously producing CIGS devices. Additionally, the typical PV cell manufacturing technique involves batch processing that necessitates touch labor, high capital costs, and low manufacturing output. In contrast, a continuous process can minimize capital costs and touch labor while maximizing product throughput and yields.

CIGS systems, in particular, pose unique challenges to manufacturers. As discussed by Ramanathan, et. al., Oct. 14, 2002, processes used for large area module manufacture involve deposition of metallic precursor stacks and the subsequent formation of the compound in a selenium and sulfur ambient. In photovoltaic applications, the p-type CIGS layer is combined with an n-type CdS layer to form a p-n heterojunction CdS/CIGS device. However, this process is problematic. The band gap of the CdS layer is still low enough to limit the short wavelength part of the solar spectrum that can reach the absorber, and this leads to a reduction in the current that can be collected. This reduction becomes proportionally more severe for higher band gap CIGS cells. Moreover, this process creates hazardous waste, the disposal of which is a challenge to potential manufacture. Thus, finding a practical alternative to the chemical bath deposition ("CBD") CdS processes is desired in the art.

While some alternatives to the CBD CdS process have been proposed, none are viable options in the context of large scale continuous manufacturing. Some of these include the addition of layers composed of, among others, ZnS, ZnO, Zn(S,O), ZnSe, $In_2S_3$, and $In(OH)_xS_y$. However, inserting these alternative buffer layers often involve more chemical steps, as well as post deposition anneals or light soaking to become fully active. Adding these post-deposition steps decreases the efficiency of the manufacturing process, and subjects the product to potential mishandling and contamination. Thus, a process for manufacturing thin-film solar cells using an alternative to CBD CdS technology to insert a buffer layer—without additional chemical steps—is desired in the art.

SUMMARY OF THE INVENTION

The present invention relates to new methods for manufacturing photovoltaic devices, and the photovoltaic devices made there from.

In a preferred embodiment, the n-type layer is formed as a continuation of a treatment whereby the CIGS is being exposed to an activity of In, Ga and Se at elevated temperatures less than 460° C. In such an embodiment, the activity of In, Ga and Se does not substantially change, but the temperature of the substrate is decreased either intentionally, or as a consequence of natural cooling from higher temperatures, to the point where the activity of In, Ga and Se no longer reacts with the CIGS absorber layer. Instead, these elements deposit and form its own compound in the form of an (In,Ga)ySe n-type layer that serves both as a junction partner and as a buffer between the CIGS and the intrinsic ZnO layer that follows. The intrinsic transparent oxide layer supports a transparent conducting oxide layer and a top metal grid.

DETAILED DESCRIPTION OF THE INVENTION

Figure 1:
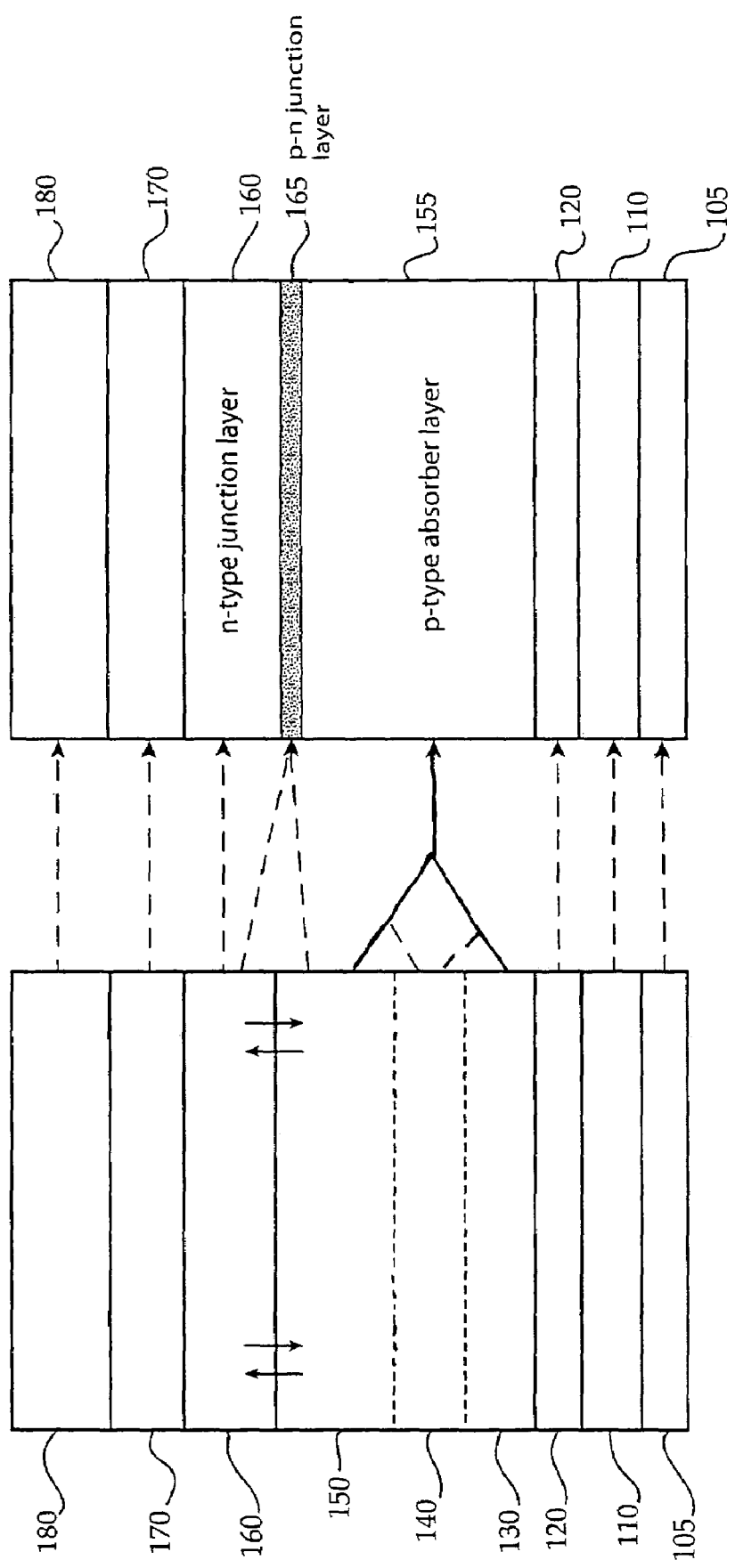
FIG. 1 shows an embodiment of a thin-film solar cell in accordance with the present invention with respect to the deposition of a photovoltaic stack design where the absorber layer is CIGS and the junction buffer layer is formed by the invention process.

Chalcopyrite ternary thin films of copper-indium-diselenide ($CuInSe_2$) and copper-indium-gallium-diselenide ($CuIn_{1-x}Ga_xSe_2$), both of which are generically referred to as $Cu(In, Ga)Se_2$, or CIGS, have become the subject of considerable interest and study for semiconductor devices in recent years. Sulfur can also be, and sometimes is, substituted for selenium, so the compound is sometimes also referred to even more generically as $Cu(In,Ga)(Se, S)_2$ so as to encompass all of these possible combinations. These devices are also referred to as $I-III-VI_2$ devices according to their constituent elemental groups. These devices are of particular interest for photovoltaic device or solar cell absorber applications. For photovoltaic applications, the p-type CIGS layer is combined with an n-type CdS layer to form a p-n heterojunction CIGS/CdS device.

The direct energy gap of CIGS results in a large optical absorption coefficient, which in turn permits the use of thin layers on the order of 1-2 μm. An additional advantage of CIGS devices is their long-term stability.

Viewing FIG. 1, all layers are deposited on a substrate 105 which may comprise one of a plurality of functional materials, for example, glass, metal, ceramic, or plastic. It is contemplated that the substrate thickness may range from approximately 10.0 μm-10 mm, and may be rigid or flexible. Preferably, the substrate functions as the back contact for interconnection.

Deposited directly on the substrate 105 is a barrier layer 110. The barrier layer 110 comprises a thin conductor or very thin insulating material and serves to block the out diffusion of undesirable elements or compounds from the substrate to the rest of the cell. This barrier layer 110 may comprise chromium, titanium, silicon oxide, titanium nitride and related materials that have the requisite conductivity and durability. It is preferable to have a thinner barrier layer 110.

The next deposited layer is the back contact layer 120 comprising non-reactive metals such as molybdenum. The back contact layer is the electrical contact for the solar cell. The layer may further serve to prevent the diffusion of chemical compounds from the other layers to the solar cell structure. The layer also serves as a thermal expansion buffer between the substrate 105 and the solar cell structure.

The next layer is deposited upon the back contact layer 120 and is a p-type semiconductor layer 130 to improve adhesion between the absorber and the back contact. The p-type semiconductor layer 130 may be a I-III$_{a,b}$-VI isotype semiconductor, but the preferred composition is Cu:Ga:Se, Cu:Al:Se or Cu:In:Se alloyed with either of the previous compounds.

In this embodiment, the formation of a p-type absorber layer 155 involves the inter-diffusion of a number of discrete layers. Ultimately, as seen in FIG. 1, the p-type semiconductor layers 130 and 150 combine into a single composite layer 155 which serves as the prime absorber of solar energy. In this embodiment, alkali materials 140 are added for the purpose of seeding the growth of subsequent layers as well as increasing the carrier concentration and grain size of the absorber layer 155, thereby increasing the conversion efficiency of the PV cell.

Referring still to FIG. 1, the next layer comprises another semiconductor layer 150, also known as the CIGS absorber layer. The layer 150 may comprise a compound or compounds, that includes a Type I element (such as Cu, or Ag), and/or a Type III element (such as In, Ga, or Al) and/or a Type VI element (such as Se, and/or S). Preferably, the p-type layer 150 comprises a I-(III$_a$,III$_b$)-VI$_2$ layer (III$_a$32 In, III$_b$32 Ga, Al) where the 0.0<IIIb/(IIIa+IIIb)<0.4. Preferably, the p-type absorber layer comprises CuIn$_{1-x}$:Ga$_x$:Se$_2$ where x ranges between 0.2 to 0.3 wherein the thickness ranges from about 1 μm to about 3 μm.

The semiconductor layer 150 is formed by delivery of the I, III, and VI precursor materials or the reacted I-III-VI compound on top of the alkali materials 140. The semiconductor layer or layers may be formed as a mixture or a series of thin layers.

In an alternate embodiment, the semiconductor layers may consist of a graded absorber layer comprising multiple layers of various combinations of sputter target precursors. For example, $Cu_2Se:Ga_2Se_3:In_2Se_3$ or any like combinations. In an alternate embodiment none of the layers include Se.

Group I, III, VI precursor materials are subsequently reacted at temperatures of about 400° C. to about 600° C. to form a I-III-VI$_2$ compound material. The presence of the p-type semiconductor 130 enables optimal I-III-VI$_2$ compound formation kinetics by providing a like chemical and physical surface on which the p-type absorber layer 155 can be formed. At temperatures of about 400° C. to about 600° C., the p-type semiconductor layer 130 and p-type semiconductor layer 150 will inter-diffuse by the exchange of the type III elements. Additionally, the Na contained in the alkali materials 140 will diffuse out and into the semiconductor layer 150, thus improving the growth of the p-type absorber layer 155 of the completed device. Once deposited, the layers are thermally treated at a temperature of about 400° C.-600° C.

After the thermal treatment of the p-type absorber layer 150, the photovoltaic production process is continued by the deposition of an n-type junction layer 160. This layer 160 will ultimately interact with the semiconductor layer 150 to form the necessary p-n junction 165. Preferably, the junction buffer layer is formed in the present invention by providing In, Se, Ga, for a period of time and at a lower temperature so that the material rather than react to form a CIGS material, instead deposits an n type material. Typically this takes place when temperature goes below about 450° C. and continues to about 300° C. One or more of the constituents of the n-type junction layer may diffuse in whole or in part into the p-type absorber layer aiding in the formation of the p-n junction. Thickness ranges from about 50 nm to about 500 nm for this layer. The bandgap of the junction layer may or may not be greater than that of the p-type absorber layer. The junction layer may be formed at an ambient temperature that is less than the maximum temperature previously achieved, such as during the upstream p-type absorber layer formation step, specifically in the range of 300° C. to 450° C.

In one embodiment, the lower temperature junction process may be delivered in the same chamber in which the p-type absorber layer is thermally formed. According to this embodiment, the completed p-type absorber layer is exposed to In, Ga, Se vapor for an additional period of time. Concurrently, the temperature is lowered from a first temperature to a preferred range of about 300° C. to 450° C. More preferably, the lower temperature range is about 350° C. to 400° C. According to this embodiment, a new buffer layer (InGa)ySe is created. In this embodiment, a chamber may thus be configured to anneal the p-type absorber precursor materials in a higher temperature region, and subsequently form a junction layer in a lower-temperature downstream region in the same chamber.

The next layer is an intrinsic transparent oxide layer 170. The transparent intrinsic oxide layer 170 is deposited next to serve as a hetero-junction with the absorber. Preferably, the transparent oxide layer 170 includes a II-VI or a IIIx VIy compound that serves as the hetero-junction partner to the I-III-VI$_2$ absorber. For example, an oxide is typically an oxide of In, Sn or Zn. Preferably, the intrinsic layer 170 comprises a thickness of about 10 nm to about 50 nm.

Finally, a conducting transparent oxide layer 180 is deposited to function as the top of the electrode of the cell. The oxide is doped to make it both conductive and. transparent that serves to carry the current to the grid structure. For example, the transparent conducting oxide layer 180 may comprise ZnO or ITO deposited by CVD or sputter. The top conducting layer is preferably transparent, conductive, and contains a compound that includes a Type II element (such as Cd or Zn), and/or a Type III element (such as In, or Al), and/or a Type IV element (such as Sn), and/or a Type VI element (such as Oxygen).

A grid structure is deposited on top of the conducting transparent oxide layer and is comprised of a metallic layer in a pattern designed to optimize collection and minimize obscuration. Preferably, the grid includes a thin metal layer of type A to assure good ohmic contact between grid structure and transparent conducting oxide and a second metal type B to carry the current to the external circuit. A typical grid metal comprises type A: nickel (10 nm to about 50 nm) and type B: aluminum or silver (3 to 5 um).

While the invention has been described with reference to particular embodiments, it will be understood by those skilled in the art that various changes may be made and equivalents may be substituted for elements thereof without departing from the scope of the invention. In addition, many modifications may be made to adapt a particular situation or material to the teachings of the invention without departing from the scope of the invention.

Therefore, it is intended that the invention not be limited to the particular embodiments disclosed as the best mode contemplated for carrying out this invention, but that the invention will include all embodiments falling within the scope and spirit of the appended claims.

What is claimed is:

1. A process for preparing a photovolatiac device comprising the steps of:
   a. providing a p-type semiconductor layer of CIGS on a substrate;
   b. exposing said p-type semiconductor layer to In+Se+Ga vapor while concurrently decreasing the temperature from a first temperature within a range of about 400° C. to 600° C. to a second temperature within a range of about 300° C. to 450° C. to form a buffer layer;
   c. exposing said buffer layer to In+Se+Ga vapor for a period of 2 to 4 minutes in a temperature range of between about 300° C. to about 450° C. to produce an n-type semiconductor layer, thus forming a p-n junction.

2. A process for preparing a photovolatiac device comprising the steps of:
   a. providing a p-type semiconductor layer of CIGS on a substrate;
   b. exposing said p-type semiconductor layer to In+Se+Ga vapor while concurrently decreasing the temperature from a first temperature within a range of about 400° C. to 600° C. to a second temperature within a range of about 300° C. to 450° C. to form a buffer layer;
   c. exposing said buffer layer to In+Se+Ga vapor resulting in deposition of an n-type semiconductor layer with a thickness of about 50 nm to about 500 nm thus forming a p-n junction.

3. A photovoltaic device comprising:
   a. a substrate with a CIGS layer;
   b. a buffer layer made by exposing said CIGS layer layer to In+Se+Ga vapor while concurrently decreasing the temperature from a first temperature within a range of about 400° C. to 600° C. to a second temperature within a range of about 300° C. to 450° C.; and
   c. an n-type junction made by providing In+Se+Ga vapor for a period of 2 to 4 minutes in a temperature range between about 300° C. to about 450° C.

4. The device of claim 3 wherein the second temperature range is about 350° C. to 400° C.

5. The device of claim 3 wherein the device is exposed to In+Se+Ga vapor for sufficient time within said second temperature range to deposit a $(In_xGa_{1-x})_2Se_3$ layer.

6. The device of claim 5 wherein deposition of said $(In_xGa_{1-x})_2Se_3$ layer takes place at 350° C. to 370° C.

7. A photovoltaic device comprising:
   a. a substrate with a CIGS layer;
   b. a buffer layer made by exposing said CIGS layer to In+Se+Ga vapor while concurrently decreasing the temperature from a first temperature within a range of about 400°0 C. to 600 ° C. to a second temperature within a range of about 300° C. to 450° C.; and
   c. an n-type junction made by providing In+Se+Ga resulting in deposition of an n-type semiconductor layer with a thickness of about 50 nm to about 500 nm.

8. The device of claim 7 wherein the temperature range is about 350° C. to 400° C.

9. The device of claim 7 wherein the device is exposed to In+Se+Ga vapor for sufficient time within said second temperature range to deposit a $(In_x Ga_{1-x})_2Se_3$ layer.

10. The device of claim 9 wherein deposition of said $(In_x Ga_{1-x})_2Se_3$ layer takes place at 350° C. to 370° C.

* * * * *